(12) United States Patent
Hung et al.

(10) Patent No.: US 9,958,917 B1
(45) Date of Patent: May 1, 2018

(54) GENERALIZED RESETTABLE MEMORY

(71) Applicant: Synopsys, Inc., Mountain View, CA (US)

(72) Inventors: Ngai Ngai William Hung, San Jose, CA (US); Dhiraj Goswami, Wilsonville, OR (US)

(73) Assignee: Synopsys, Inc., Mountain View, CA (US)

( * ) Notice: Subject to any disclaimer, the term of this patent is extended or adjusted under 35 U.S.C. 154(b) by 25 days.

(21) Appl. No.: 15/368,457

(22) Filed: Dec. 2, 2016

(51) Int. Cl.
| | | |
|---|---|---|
| *G11C 7/10* | (2006.01) | |
| *G06F 1/24* | (2006.01) | |
| *G11C 7/22* | (2006.01) | |
| *G06F 13/10* | (2006.01) | |
| *G06F 13/12* | (2006.01) | |
| *G06F 11/30* | (2006.01) | |

(52) U.S. Cl.
CPC ............ *G06F 1/24* (2013.01); *G06F 11/3037* (2013.01); *G06F 11/3055* (2013.01); *G06F 13/105* (2013.01); *G06F 13/124* (2013.01); *G11C 7/1012* (2013.01); *G11C 7/22* (2013.01)

(58) Field of Classification Search
CPC .... G06F 1/24; G06F 11/3055; G06F 11/3037; G06F 13/124; G06F 13/105; G11C 7/1012; G11C 7/22; H03K 19/17728
See application file for complete search history.

(56) References Cited

U.S. PATENT DOCUMENTS

| | | | | | |
|---|---|---|---|---|---|
| 5,894,484 | A | * | 4/1999 | Illes | .................... G01R 31/2834 712/2 |
| 5,925,145 | A | * | 7/1999 | Illes | ................. G01R 31/31919 714/738 |
| 6,263,483 | B1 | * | 7/2001 | Dupenloup | ......... G06F 17/5045 716/104 |
| 6,836,420 | B1 | * | 12/2004 | Seshadri | ............. G06F 17/5045 365/51 |
| 7,417,888 | B2 | * | 8/2008 | Seshadri | ............. G06F 17/5045 365/154 |
| 7,458,040 | B1 | * | 11/2008 | Yu | ............................ G11C 7/20 365/51 |
| 8,705,259 | B2 | * | 4/2014 | Yu | ............................ G11C 7/22 211/100 |
| 2003/0112031 | A1 | * | 6/2003 | Agrawal | ......... H03K 19/17744 326/41 |
| 2017/0357743 | A1 | * | 12/2017 | Larzul | ................ G06F 17/5036 |

* cited by examiner

*Primary Examiner* — Khamdan Alrobaie
(74) *Attorney, Agent, or Firm* — Fenwick & West LLP

(57) ABSTRACT

Disclosed is a resettable memory device including a memory unit, a reset status indicator circuit, a logic sampling circuit, and a multiplexer for performing a reset function. The memory unit includes cells for storing states of signals in a design under test. The reset status indicator stores states of indicators indicating whether corresponding cells should be reset or not. Responsive to the reset status indicator indicating that the value of the cell should not be reset, the multiplexer receives the value stored in the cell and outputs the retrieved value from the cell. Responsive to the reset status indicator indicating that the value of the cell should be reset, the multiplexer outputs a reset value instead of the value stored in the cell. The reset value may be changed by the logic sampling circuit at different time periods or certain logic conditions, and output through the multiplexer.

20 Claims, 9 Drawing Sheets

GENERALIZED RESETTABLE MEMORY

TECHNICAL FIELD

The disclosure generally relates to electronic circuit design, and more specifically to an apparatus for implementing a circuit including a resettable memory device and a method of operating the same.

BACKGROUND

A memory unit can be used to implement a number of storage related devices such as a random access memory (RAM), a first-in-first-out (FIFO) queue (e.g., by appropriately controlling the address values of the memory unit such that a FIFO queue is emulated with the memory unit), a content addressable memory (CAM), a shift register, etc. Some memory units as being offered to designers to implement their circuit designs, however, may not have a reset function. A reset function effectively "clears" a value of the memory unit's cell to some "reset" value (e.g., "0", or other predetermined values).

Several approaches have been proposed to allow a reset function to be realized using a non-resettable memory unit. In one approach, the non-resettable memory unit can operate together with flip flops for indicating whether values of corresponding cells should be reset or not. If a flip flop indicates a value of a cell should be reset, a predetermined reset value can be output, instead of outputting a value stored in the non-resettable memory unit.

However, the conventional approach of realizing a reset function using the non-resettable memory unit suffers from a few drawbacks. In one aspect, the conventional approach suffers from a lack of flexibility in changing the reset value. For example, the reset value is fixed to a predetermined constant value and prevents different reset values to be assigned to a same cell at different time periods. Changing the reset values in the conventional approach may be performed by redesigning or recompiling the circuit designs, which may involve time consuming and inconvenient processes.

BRIEF DESCRIPTION OF DRAWINGS

The disclosed embodiments have other advantages and features which will be more readily apparent from the detailed description, the appended claims, and the accompanying figures (or drawings). A brief introduction of the figures is below.

DETAILED DESCRIPTION

Figure 1:
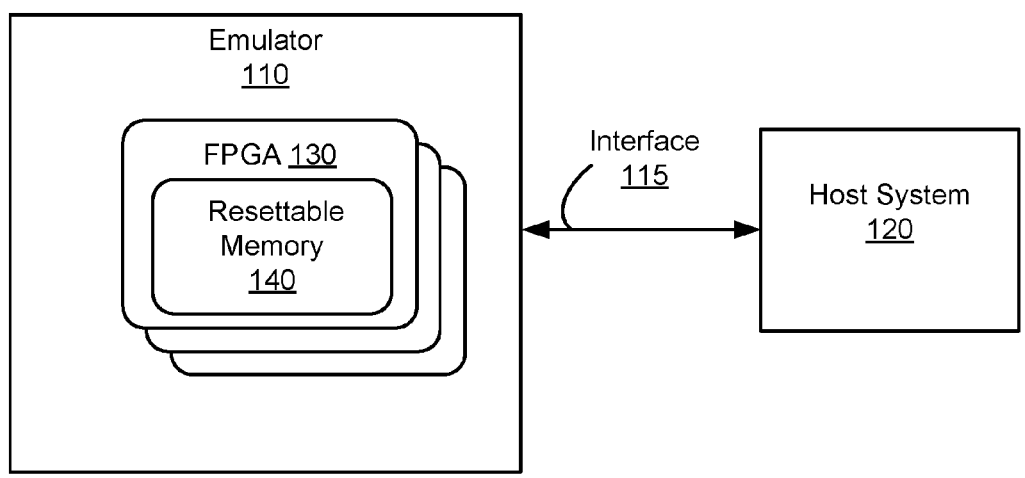
FIG. 1 is a block diagram of an emulation environment, according to one or more embodiments.

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. The figures depict embodiments of the disclosed system (or method) for purposes of illustration only. It should be recognized from the following description that alternative embodiments of the structures and methods illustrated herein may be employed without departing from the principles described herein.

The figures use like reference numerals to identify like elements. A letter after a reference numeral, such as "230A," indicates that the text refers specifically to the element having that particular reference numeral. A reference numeral in the text without a following letter, such as "230," refers to any or all of the elements in the figures bearing that reference numeral.

Configuration Overview

Disclosed is a resettable memory device with configurable reset values and a method of operating the same. The reset values of the resettable memory device can be configured or changed according to detection of certain events or a user input at different time periods without recompiling of a DUT.

In one or more embodiments, the resettable memory device includes a memory unit, a reset status indicator circuit, a sequential logic sampling circuit, and a multiplexer for performing a reset function. The components in the resettable memory device are generally available in any reconfigurable circuits (e.g., FPGAs or emulators). The memory unit includes a plurality of cells for storing states of signals in the DUT. In one aspect, the memory unit is implemented in a simple structure for performing read/write operations without any reset function. The reset status indicator circuit is a storage component that stores states of indicators indicating whether corresponding cells should be reset or not. When reading a value of a cell, if the reset status indicator indicates the value of the cell should not be reset, the multiplexer receives the value stored in the cell and outputs the received value from the cell. If the reset status indicator indicates the value of the cell should be reset, the multiplexer outputs a reset value instead of the value stored in the cell. The reset value may be changed by the sequential logic sampling circuit at different time periods or certain logic conditions, and output through the multiplexer.

In one or more embodiments, the sequential logic sampling circuit is synchronous to one or more clock signals to ensure different reset values to be generated at proper timings. Specifically, the sequential logic sampling circuit receives variable test inputs, and performs sequential logic computations according to the variable test inputs synchronous to the one or more clock signals. The variable test inputs may be externally provided for example, from an external circuitry, a voltage supplier, a signal generator, etc. that is distinct from the resettable memory device. The variable test inputs may have unknown or different propagation delays. Despite the unknown or different propagation delays of the variable test inputs, the sequential logic sampling circuit allows complex logic computations to be performed at proper timings.

In one or more embodiments, the sequential logic sampling circuit generates one or more reset signals to cause one or more indicators to indicate corresponding cells should be reset. Accordingly, the one or more reset signals can be internally generated within the resettable memory device based on the variable test inputs or logic computation results of the variable test inputs.

A signal refers to, but is not limited to, a net, a wire, a variable, or an element of a design having a value (i.e., a state) carried, monitored or traced. In one or more embodiments, values (or states) of signals can collectively represent a single value. For example, three signals or a three bit signal having values '1,' '0,' and '1' in a binary representation respectively can collectively represent a single value '9' in a decimal representation.

Emulation Environment

FIG. 1 is a block diagram illustrating an emulation environment 100 (also referred to as an "emulation system" or "emulation environment system 100"), according to one example embodiment. The emulation environment 100 includes an emulator 110 and a host system 120. The emulator 110 and the host system 120 communicate through an interface 115.

The interface 115 is a communication medium that allows communication between the host system 120 and the emulator 110. In one embodiment, the interface 115 is one or more cables with electrical connections. For example, the interface 115 may be one or more USB, LAN, optical, IEEE 1394 (FireWire), or custom built cables. In other embodiment, the interface 115 is a wireless communication medium or a network with one or more points of access. For another example, the interface 115 may be a wireless communication medium employing a Bluetooth® or IEEE 802.11 protocol. In one embodiment, the interface 115 is enabled during the operation of the host system 120 and the emulator 110. In one embodiment, the interface 115 is only enabled when the host system 120 and the emulator 110 need to exchange information with each other.

The emulator 110 is a hardware system that emulates designs under test (DUTs). A DUT includes one or more circuit designs. The DUT emulated can be either combinatorial, sequential, or a combination of both. The emulator 110 includes multiple field-programmable gate arrays (FPGAs) 130 that can be configured to emulate a DUT. Each FPGA 130 implements a resettable memory device 140 (e.g., trace buffer) that stores values of signals traced by the FPGA 130 during emulation (e.g., the states of DUT signals during emulation). Emulation refers to imitating the behavior of an electronic design with configurable hardware components. An emulation model may be based on a hardware description language, e.g., Verilog, which may be compiled into a format used by an emulation system. Emulation may be used to assist with functional verification of a design under test. Additionally or alternatively, the emulator 110 includes external resettable memory devices separate from the FPGAs 130, where one or more of the FPGAs 130 can store and retrieve data at the external resettable memory devices.

In other embodiments, the emulator 110 includes other types of configurable logic circuits instead of FPGAs 130. In other embodiments, the emulator 110 includes a mix of FPGAs 130 or other configurable circuits and a mix of memory devices 140 located in the components or separated from them, in order to achieve an optimal trace system. In another embodiment, the emulator 110 does not contain memory devices 140 dedicated to trace, and uses memory devices 140 that could be used to model the design, or stream the traced data directly over the interface 115. The emulator 110 may transmit values of traced signals stored in one or more resettable memory devices 140 to the host system 120, after the emulation is finished or during the emulation. The emulator 110 may also transmit values of traced signals stored in one or more memory devices 140 responsive to receiving a request from the host system 120 or prior to receiving a request from the host system 120. The values of the traced signals transmitted to the host system 120 by the emulator 110 can span one or more time frames, where each time frame includes multiple DUT clock cycles. In one or more embodiments, the FPGA 130 may be omitted or replaced with other types of reconfigurable circuits.

For a DUT that is to be emulated, the emulator 110 receives from the host system 120 through the interface 115 one or more binary files including a description of the DUT (e.g., a mapping of a gate level or a hardware description language (HDL) level description of the DUT). The binary files describe partitions of the DUT created by the host system 120 and a mapping of each partition to an FPGA 130. Based on the binary files, the emulator 110 configures each FPGA 130 to emulate the partition of the DUT mapped (assigned) to it and to trace certain signals in its respective partition. The FPGAs 130 collectively emulate the DUT. The values of signals traced by an FPGA 130 during emulation are temporarily stored by the FPGA 130 in its resettable memory device 140 or external memory device before being transferred to the host system 120 through the interface 115. These signals as described below are used for generating additional information and/or processing the results of the emulation of the DUT.

The host system 120 configures the emulator 110 to emulate a DUT. The host system 120 may be a single computer or a collection of multiple computers. In the embodiment where the host system 120 is comprised of multiple computers, the functions described herein as being performed by the host system 120 may be distributed among the multiple computers. The host system 120 may be indirectly connected to the emulator 110 through another device, computer or network.

The host system 120 receives from a user a description of a DUT to be emulated by the emulator 110. In one embodiment, the description of the DUT is in a type of HDL, such as register transfer language (RTL). The host system 120 creates a gate level netlist based on the HDL description of the DUT. The host system 120 uses the HDL or the gate level netlist to partition the DUT into multiple partitions. The host system 120 maps (assigns) each partition to one or more FPGAs 130 included in the emulator 110. Together the FPGAs 130 will emulate the DUT and trace certain signals of the DUT.

The host system 120 creates binary files, which include information to configure the FPGAs 130 based on the DUT and the mappings. A binary file may include, for example, a design description of one or more partitions (e.g., gate level or HDL description), mapping information (e.g., mappings of partitions), connection information (e.g., connections between components of the DUT and/or connections between FPGAs) and design constraints for the DUT.

The host system 120 transmits the binary files to the emulator 110 so that the emulator 110 can configure the FPGAs 130 to emulate their respective mapped partition. The host system 120 instructs the emulator 110 to emulate the DUT. Each FPGA 130 emulates its respective partition and stores values of signals traced during the emulation in its resettable memory device 140 or external resettable memory devices.

Further, the host system 120 receives verification settings indicating values of signals of the DUT for performing analysis or verification of the DUT. The verification settings may be, for example, a request from a user to trace certain signals of the DUT for debugging or testing the DUT. The verification settings may also include a state machine used for analyzing the performance of the DUT. The verification settings may include a system C model, C/C++ model, program or scripts analyzing design emulation results.

In one embodiment, contents in the resettable memory device 140 are transmitted to the host system 120 by the emulator 110 through the interface 115, when the FPGAs 130 are not emulating the DUT. In another embodiment, the emulator 110 transmits to the host system 120 through the interface 115 the contents in the resettable memory device 140 while the FPGAs 130 are emulating the DUT, thereby generating and transmitting a stream of traced information over the interface 115 in parallel with the emulation of the DUT.

Figure 2:
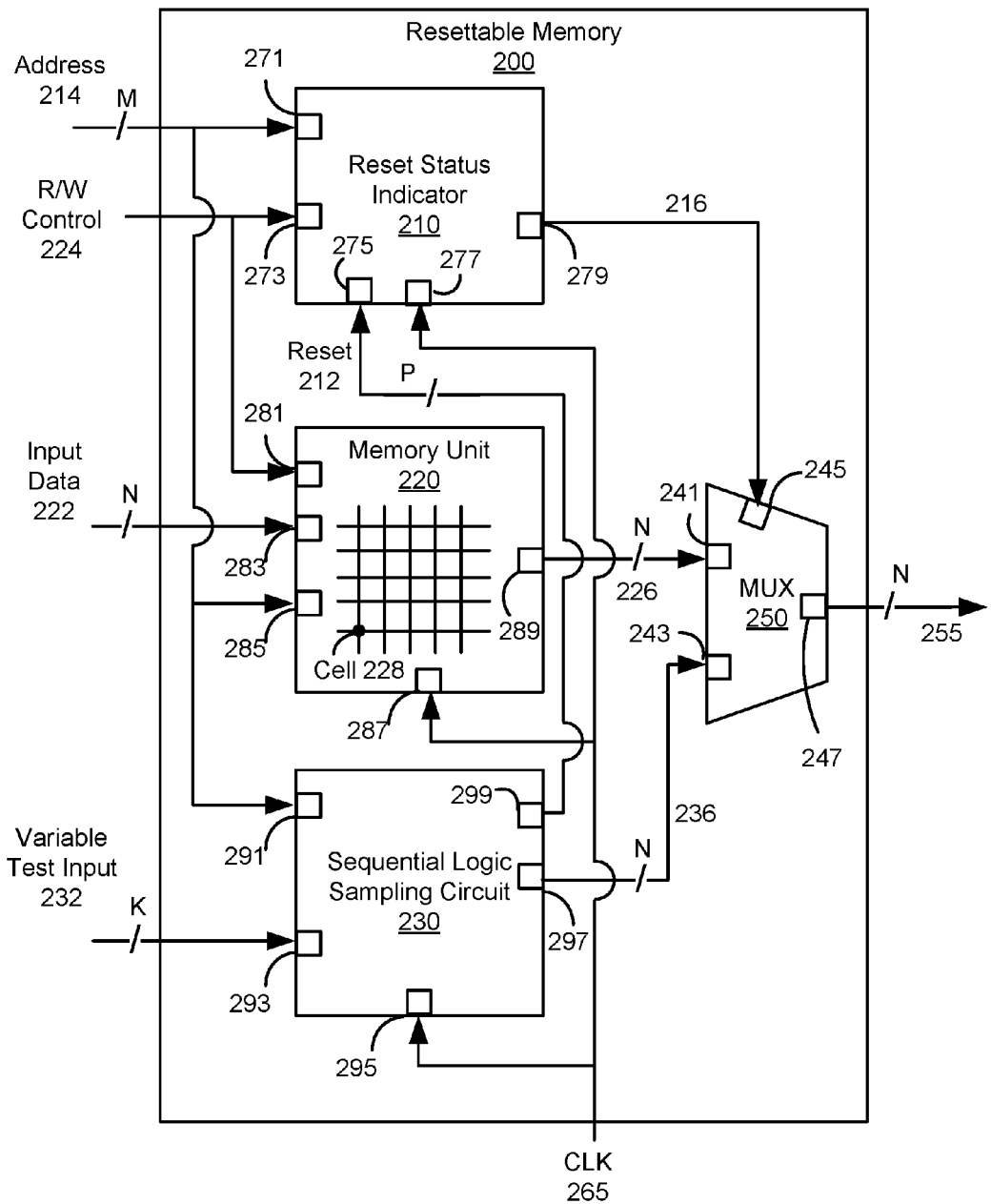
FIG. 2 illustrates a resettable memory device capable of changing reset values, according to one or more embodiments.

FIG. 2 illustrates a resettable memory device 200 capable of changing reset values, according to one or more embodiments. The resettable memory device 200 may be implemented as a resettable memory device 140 in FIG. 1. The resettable memory device 200 may include a reset status indicator circuit 210, a memory unit 220, a sequential logic sampling circuit 230, and one or more multiplexers (MUXes) 250. Each of these components can be implemented as a hardware component generally available in reconfigurable circuits (e.g., FPGA). The reset status indicator circuit 210 may have a reset status indicator circuit input port 271 coupled to an address line through which the address signal 214 is received, a reset status indicator circuit read/write (R/W) control input port 273 coupled to a R/W control line through which the R/W control signal 224 is received, a reset input port 275 coupled to a reset line through which the reset signal 212 is received, and a reset status indicator circuit clock input port 277 coupled to a clock line through which the clock signal 265 is received, and a reset status indicator circuit output port 279 coupled to a control port 245 of the multiplexer 250. The memory unit 220 may have a memory unit R/W control input port 281 coupled to the R/W control line, N number of memory unit data input ports 283 each coupled to a corresponding input data line through which one (1) bit of an input data signal 222 is received, a memory unit address input port 285 coupled to the address line, a memory unit clock input port 287 coupled to the clock line, and N number of memory unit output ports 289 each coupled to a corresponding first input port 241 of the multiplexer 250. The sequential logic sampling circuit 230 may have a logic sampling circuit address input port 291 coupled to the address line and K number of logic sampling circuit variable test input ports 293 each coupled to a corresponding variable test input line through which one (1) bit of the variable test input signal 232 is received, respectively, a logic sampling circuit clock input port 295 coupled to the clock line, and N number of logic sampling circuit output ports 297 each coupled to a corresponding second input port 243 of the multiplexer 250. The sequential logic sampling circuit 230 may include a reset output port 299 coupled to the reset input port 275 of the reset status indicator circuit 210 and provide the reset signal 212 to the reset status indicator circuit 210 according to the variable test input signal 232. The multiplexers 250 may include N number of multiplexer output ports 247 each coupled to a corresponding output line through which the memory output signal 255 can be output.

Operationally, the resettable memory device 200 receives an M bit address signal 214, a read or write control signal 224 (herein also referred to as "a R/W control signal 224"), a P bit reset signal 212, an N bit input data signal 222, a K bit variable test input signal 232, and a clock signal 265. The resettable memory device 200 includes a plurality of cells 228, each of which stores a state of a corresponding input data signal 222 identified by the address signal 214. The R/W control signal 224 instructs the resettable memory device 200 to store (or write) states of the input data signal 222 at cells 228 identified by the address signal 214, or the resettable memory device 200 to output (or read) states stored at cells identified by the address signal 214 through a N bit memory output signal 255. The reset signal 212 instructs the resettable memory device 200 to reset (or not) states stored at cells identified by the address signal 214 to reset values. In one aspect, the reset values are determined based on the time varying variable test input signal 232. The variable test input signal 232 can be changed at different time periods or DUT clock cycles without redesigning or recompiling of a DUT.

The reset status indicator circuit 210 and the memory unit 220 may be synchronous to the clock signal 265. In addition, the sequential logic sampling circuit 230 may be synchronous to the clock signal 265. These components operate together to perform functions of a resettable memory device 200 as disclosed herein. In some embodiments, additional clocks may feed to the sequential logic sampling circuit 230, where said additional clocks can be a subset of the variable test input 232.

The memory unit 220 is a storage component for storing states of input data at corresponding cells 228 identified by the address signal 214. Preferably, the memory unit 220 is implemented as a memory component available in reconfigurable circuits (e.g., FPGA) without any reset capability. The memory unit 220 may include N number of cells 228 per row, and may store values at cells 228 or may output values stored in cells 228 for a given row identified by the address signal 214. For storing (writing) input data from the input data signal 222, the memory unit 220 stores input data at cells 228 identified by the address signal 214, in response to the R/W control signal 224 instructing the memory unit 220 to store (write) data. For outputting (reading) data stored in the memory unit 220, the memory unit 220 outputs states stored at cells 228 (e.g., cells 228 in a row) identified by the address signal 214 through an N bit memory unit storage signal 226, in response to the R/W control signal 224 instructing the memory unit 220 to output (read) data. In one implementation, the memory unit 220 includes N number of memory unit output ports 289, where each memory unit output port 289 outputs a corresponding 1 bit of the memory unit storage signal 226.

The reset status indicator circuit 210 is a storage component for indicating whether states of corresponding cells 228 in the memory unit 220 should be reset or not. The reset status indicator circuit 210 includes a plurality of indicators, where each indicator is associated with corresponding one or more cells 228 of the memory unit 220 (e.g., cells 228 in a row). The reset status indicator circuit 210 may be implemented as a memory component in reconfigurable circuits (e.g., FPGA) without any reset function or with flip flops as disclosed in detail with respect to FIG. 3.

The reset status indicator circuit 210 operates in conjunction with the memory unit 220 responsive to the R/W control signal and the reset signal 212. Specifically, in response to (i) the R/W control signal 224 instructing the memory unit 220 to store (write) data and (ii) the reset signal 212 in a first state (e.g., high state or logic '1') instructing that states of one or more cells 228 identified by the address signal 214 need to be reset, the reset status indicator circuit 210 configures an indicator associated with cells 228 identified by the address signal 214 to indicate the one or more associated cells 228 should be reset. In response to (i) the R/W control signal 224 instructing the memory unit 220 to store (write) data and (ii) the reset signal 212 in a second state (e.g., low state or logic '0') instructing that states of cells 228 identified by the address signal 214 should not be reset, the reset status indicator circuit 210 configures an indicator identified by the address signal 214 to indicate the one or more associated cells 228 should not be reset. In response to the R/W control signal 224 instructing the memory unit 220 to output (read) data, the reset status indicator circuit 210 outputs a state of an indicator identified by the address signal 214 as a reset status signal 216. The reset status indicator circuit 210 receives the reset signal 212 from the sequential logic sampling circuit 230. Alternatively, the reset status indicator circuit 210 receives the reset signal 212 from other circuitries (e.g., external inputs).

The sequential logic sampling circuit 230 is a logic circuit that receives the variable test input signal 232 and generates an N bit reset value signal 236 including reset values of cells 228 identified by the address signal 214 based on the variable test input signal 232. The variable test input signal 232 may be generated from a circuit within the DUT, or provided from an external device (e.g., voltage/current supplier, signal generator, etc.). The variable test input signal 232 may be changed at different time periods or during testing of the DUT. Hence, the reset value signal 236 output by the sequential logic sampling circuit 230 may be changed accordingly at different time periods to provide flexibility in testing functionality of the DUT with different reset values. In one implementation, the sequential logic sampling circuit 230 includes N number of logic sampling circuit output ports 297, where each logic sampling circuit output port outputs a corresponding 1 bit of the reset value signal 236. Each bit of the reset value signal 236 may have different states or values than other bits of the reset value signal 236. The sequential logic sampling circuit 230 may be synchronous to the clock signal 265 to ensure logic computation based on the variable test input signal 232 to be performed at proper timings.

In one embodiment, the sequential logic sampling circuit 230 generates a reset signal 212 based on the variable test input signal 232. Specifically, the sequential logic sampling circuit 230 performs logic computation based on the variable test input signal 232 externally provided, and internally generates the reset signal within the resettable memory device 200 according to the logic computation results of the variable test input signal 232.

The MUX 250 is a circuit component that outputs either the memory unit storage signal 226 or the reset value signal 236 through the memory output signal 255 according to the reset status signal 216. In one embodiment, the MUX 250 includes N number of 2 input multiplexers, where each 2 input multiplexer includes (i) a first input port coupled to a corresponding memory unit output port of the memory unit 220 providing 1 bit of the memory unit storage signal 226, (ii) a second input port coupled to a corresponding logic sampling circuit output port of the sequential logic sampling circuit 230 providing a 1 bit of the reset value signal 236, (iii) a control port coupled to a reset status indicator circuit output port of the reset status indicator circuit 210 providing the reset status signal 216, and (iv) a multiplexer output port through which a 1 bit of the memory output signal 255 can be provided. In one aspect, each multiplexer couples the multiplexer output port with one of the first input port and the second input port according to the reset status signal 216 received through the control port. Specifically, responsive to the reset status signal 216 indicating that a state of a cell 228 should be reset, a multiplexer output port is decoupled from the first port and is coupled to the second port to output a corresponding bit of the reset value signal 236. Responsive to the reset status signal 216 indicating that a state of a cell 228 should not be reset, the multiplexer output port is decoupled from the second port and is coupled to the first port to output a corresponding bit of the memory unit storage signal 226.

In one embodiment, the reset status indicator circuit 210, the memory unit 220, and the sequential logic sampling circuit 230 are synchronous to the clock signal 265 to ensure proper values to be received at and output by the multiplexer 250. Because the variable test input signal 232 is provided from an external source (e.g., another integrated circuit, a voltage supplier, or a signal generator), synchronous operation of the reset status indicator circuit 210, the memory unit 220, and the sequential logic sampling circuit 230 allows correct reset values to be output, regardless of unknown or different propagation delays associated with the variable test input signal 232.

Accordingly, the resettable memory device 200 can operate as if states stored at the cells 228 of the memory unit 220 identified by the address signal 214 are reset, without actually resetting the states stored at the cells 228. Hence, the memory unit 220 having a simple structure available in reconfigurable circuits (e.g., FPGAs) can be implemented without a customized resettable memory component. Additionally, the resettable memory device 200 disclosed herein allows flexibility in changing the reset values during testing of the DUT or during emulation without having to redesign or recompile the DUT.

In some embodiments, the resettable memory device 200 can be implemented as a memory unit 220 or the reset status indicator circuit 210 of another resettable memory device 200.

In some embodiments, flip flops (not shown for simplicity) are added to ensure generation of signals at proper timing. For example, a first flip flop (not shown for simplicity) is inserted between the reset status indicator circuit output port of the reset status indicator circuit 210 and the control port of the MUX 250, second flip flops (not shown for simplicity) are inserted between the memory unit output ports of the memory unit 220 and the first input ports of the MUX 250 respectively, and third flip flops between variable test input ports for providing the variable test input signal 232 and input ports of the sequential logic sampling circuit 230, respectively. In some embodiment, the first flip flop, the second flip flops and the third flip flops are synchronized to the clock signal 265.

Figure 3:
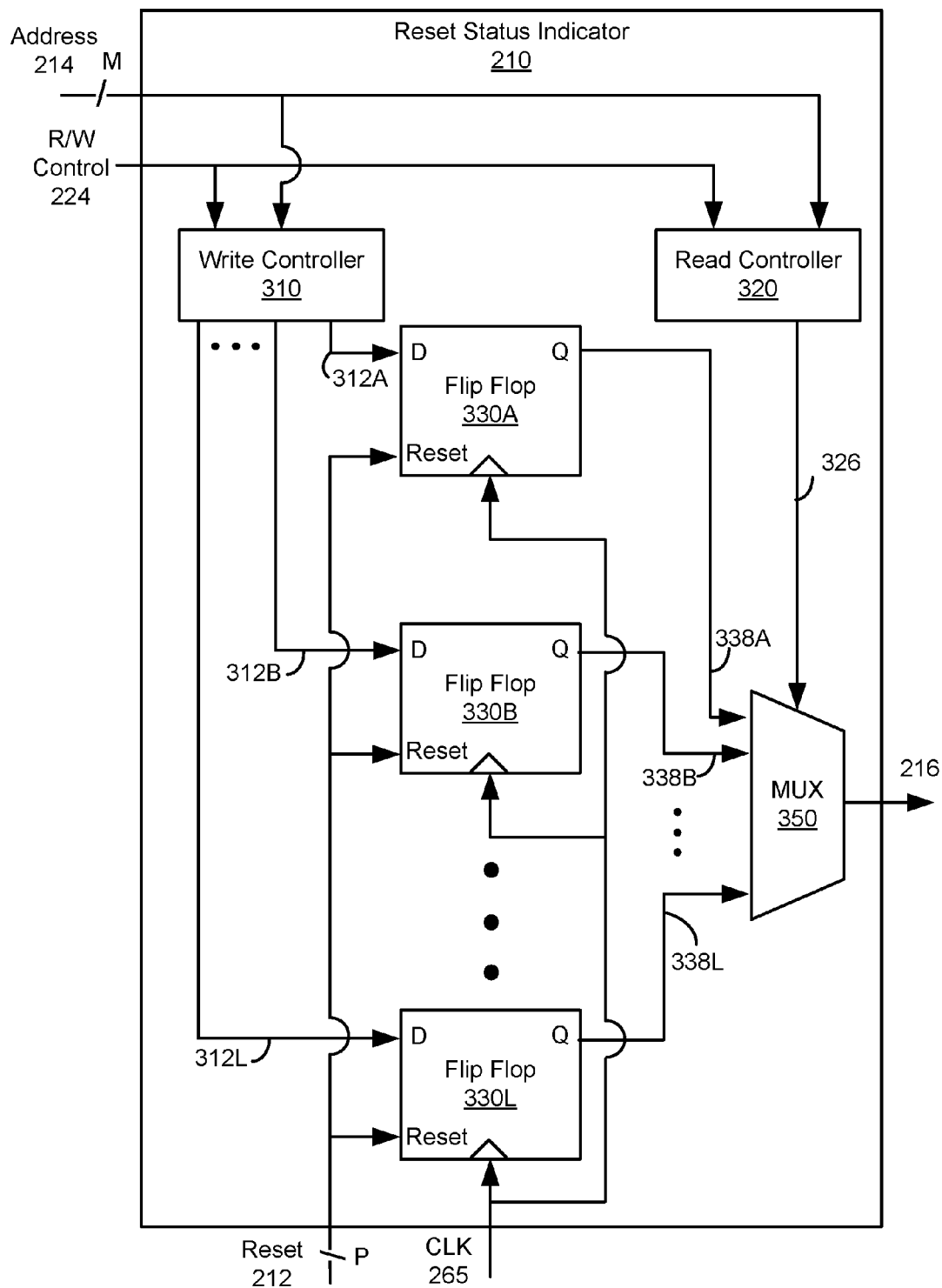
FIG. 3 illustrates a reset status indicator circuit of the resettable memory device shown in FIG. 2, according to one or more embodiments.

FIG. 3 illustrates a reset status indicator circuit 210 of FIG. 2, according to one or more embodiments. In one embodiment, the reset status indicator circuit 210 includes a write controller 310, a read controller 320, flip flops 330A, 330B . . . 330L, and a multiplexer (MUX) 350. The address signal 214 is coupled to the write controller 310 and the read controller 320. In addition, the R/W control signal 224 is coupled to the write controller 310 and the read controller 320. Moreover, the reset signal 212 is coupled to reset ports of the flip flops 330. These components operate together to generate a reset status signal 216 to indicate whether one or more cells 228 (e.g., cells 228 in a row) of the memory unit 220 identified by the address signal 214 should be reset or not. In other embodiments, some components shown in FIG. 3 may be omitted, or arranged in different a configuration. In some embodiments, the reset status indicator circuit 210 may be implemented with resettable memory circuits.

The write controller 310 is a circuit component that receives the address signal 214 and the R/W control signal 224, and generates the status update signals 312A, 312B . . . 312L to control respective flip flops 330. Based on the R/W control signal 224 and the address signal 214, the write controller 310 detects that input data is stored (written) at one or more cells 228 of the memory unit 220 identified by the address signal 214. Accordingly, the write controller 310 generates the status update signal 312 corresponding to the one or more cells 228 identified by the address signal 214 for indicating that the one or more cells 228 should not be reset.

The flip flops 330 store indicators 338A, 338B . . . 338L, each indicating whether one or more corresponding cells 228 should be reset or not. In one implementation, each flip flop 330 includes an input port D coupled to a status update signal 312 from the write controller 310, a reset port coupled to the reset signal 212, a clock port coupled to the clock signal 265, and an output port Q coupled to a corresponding indicator 338. In response to the reset signal 212 instructing cells 228 of the memory unit 220 to be reset, the flip flops 330 are reset to cause indicators 338 to indicate the cells 228 should be reset. Resetting of the flip flops 330 may be synchronous or asynchronous to the clock signal 265. The flip flop 330 receives a status update signal 312 from the write controller 310, and updates a corresponding indicator 338 to indicate that input data is stored at corresponding one or more cells 228, responsive to, for example, a rising edge (or a falling edge) of the clock signal 265. Indicators 338 are provided to respective input ports of the MUX 350.

The read controller 320 is a circuit component that receives the address signal 214 and the R/W control signal 224, and generates an output control signal 326 to control which indicator 338 to output as the reset status signal 216. Based on the address signal 214 and the R/W control signal 224, the read controller 320 detects that states stored in cells 228 of the memory unit 220 identified by the address signal 214 are being output (or read). Responsive to detecting the states of the cells 228 are being output, the read controller 320 generates the output control signal 326 for controlling the MUX 350 to output one of the indicators 338 as the reset status signal 216.

The MUX 350 is a multiplexer that receives indicators 338 from the flip flops 330, and outputs one of the indicators 338 as the reset status signal 216 according to the output control signal 326 from the read controller 320. The MUX 350 may be implemented as an L input multiplexer or a combination of multiple multiplexers.

Figure 4A:
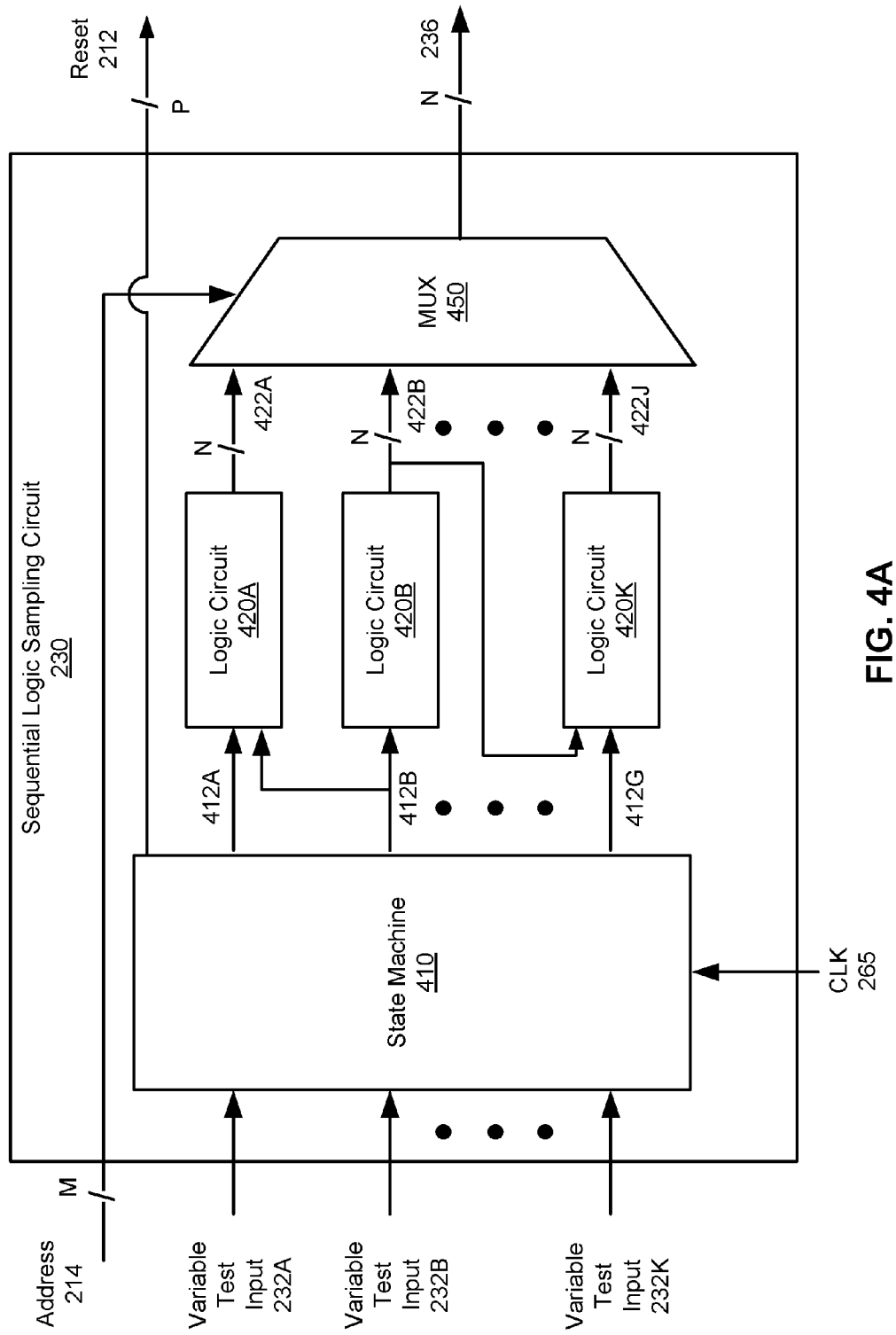
FIG. 4A illustrates a logic sampling circuit of the resettable memory device shown in FIG. 2, according to one or more embodiments.

FIG. 4A illustrates a sequential logic sampling circuit 230, according to one or more embodiments. In one embodiment, the sequential logic sampling circuit 230 includes a state machine 410, logic circuits 420A, 420B . . . 420K, and multiplexers (MUX) 450. These components operate together to generate the N bit reset value signal 236 reconfigurable at different time periods, according to the variable test input signals 232 for cells 228 identified by the address signal 214. In other embodiments, some components shown in FIG. 4A may be omitted, or arranged in a different configuration. For example, the state machine 410 or the logic circuits 420 maybe omitted.

The state machine 410 is a sequential logic circuit (or a combination of a sequential logic circuit and a combinatorial logic circuit) for receiving a respective variable test input signal 232, and providing state machine outputs 412 to the logic circuit 420. In one aspect, the state machine 410 comprises a latch or a flip flop synchronized with the clock signal 265 or other reference signals and generates the state machine outputs 412 synchronized with the clock signal 265. The state machine 410 ensures logic computation by the logic circuit 420 to be performed at proper timing.

In one aspect, the state machine 410 receives the variable test input signal 232, and performs logic computation to generate the P bit reset signal 212. Specifically, the state machine 410 performs logic computation based on the variable test input signal 232 externally provided, and internally generates the reset signal 212 within the resettable memory device 200 according to the logic computation results of the variable test input signal 232.

The logic circuits 420 may be any circuit components (combinatorial, sequential or a combination of them) for generating different N bit logic computation result signals 422A, 422B . . . 422J based on the state machine outputs 412. Each of the logic computation result signals 422 include a logic computation result corresponding to one or more cells identified by the address signal 214. In one example, the logic circuit 420A receives inputs from the state machine 410. In another example, the logic circuit 420K receives an output of another logic circuit 420B as its input. The logic circuits 420 in conjunction with the state machine 410 can be arranged in any configuration to implement customized functionality (e.g., detection of a certain event or performing any logic computation). One or more of the logic circuits 420 may be associated with one or more corresponding cells 228 (e.g., cells 228 in a row) identified by the address signal 214, and perform logic computations specific to the corresponding address. According to the logic circuits 420, the logic computation result signals 422 depending on the variables test input signals 232 and the address signal 214 can be generated.

The MUX 450 is a multiplexer for selecting one or more of the logic computation result signals 422 from the logic circuits 420, and outputting the selected one or more logic computation result signals 422 as the N bit reset value signal 236 according to the address signal 214. Specifically, the MUX 450 outputs a logic computation result signal 422 corresponding to one or more cells 228 identified by the address signal 214 as reset values of the one or more cells 228. The MUX 350 may be implemented as a J input multiplexer or a combination of multiple multiplexers.

Figure 4B:
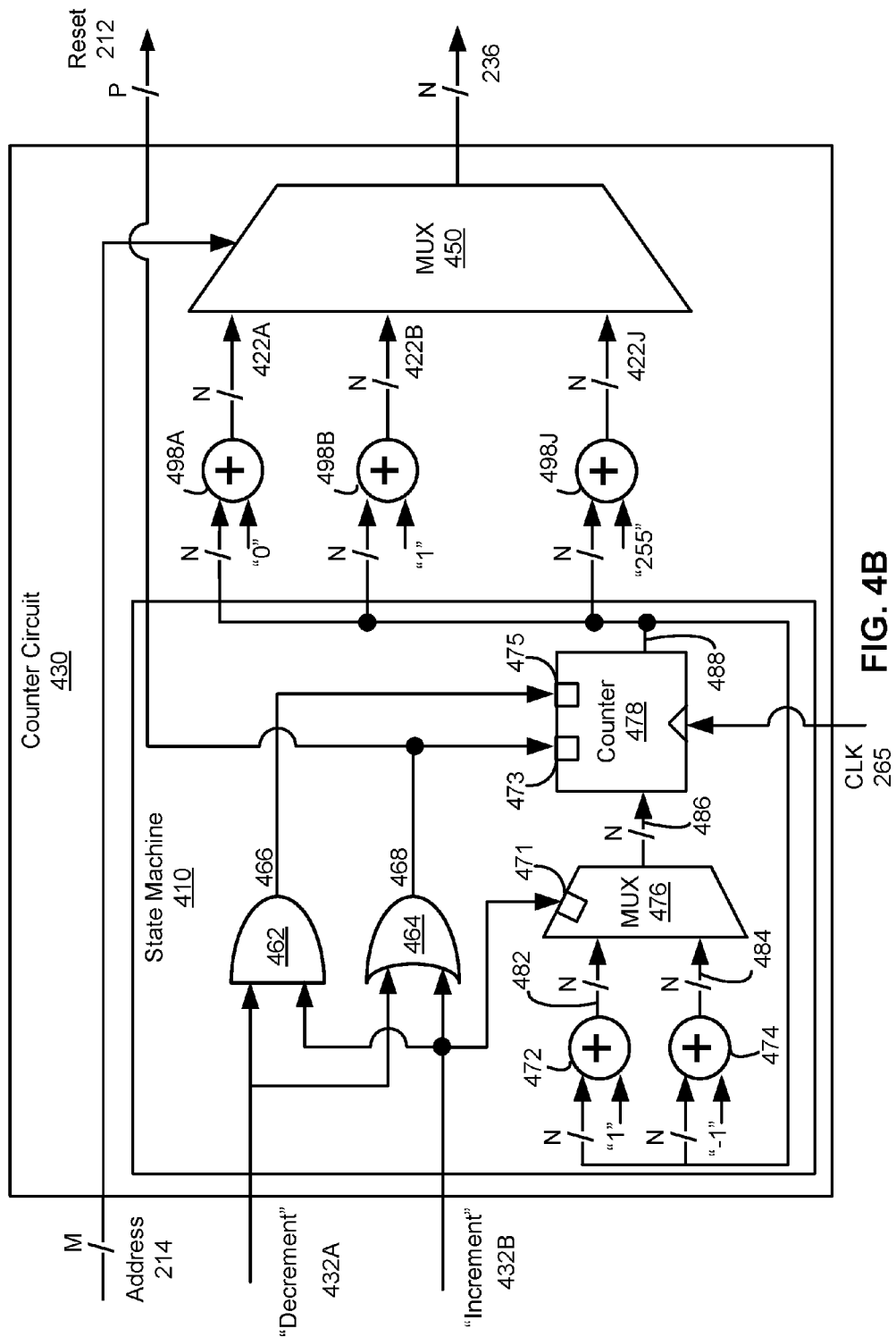
FIG. 4B illustrates an example counter circuit generating different counter values based on variable test inputs as reset values, according to one or more embodiments.

FIG. 4B illustrates an example counter circuit 430 generating different counter values as reset values based on variable test inputs, according to one or more embodiments. The counter circuit 430 may be implemented as the sequential logic sampling circuit 230 of FIG. 2, and generate the reset value signal 236 according to the decrement signal 432A, the increment signal 432B or both. The decrement signal 432A and the increment signal 432B may be variable test input signals 232 of FIG. 2. In one example, the counter circuit 430 includes a state machine 410, N bit adders 498A, 498B . . . 498J, and a multiplexer 450. Each of the N bit adders 498 may be a corresponding one of the logic circuits 420 of FIG. 4A. These components operate together to receive the address signal 214, the decrement signal 432A and the increment signal 432B, and generate the P bit reset signal 212 and the reset value signal 236 that may be changed according to the decrement signal 432A or the increment signal 432B during emulation.

The state machine 410 receives the decrement signal 432A, the increment signal 432B or both, and updates a counter signal 488 (e.g., N bit). The counter signal 488 indicates a counter value that can be changed to vary reset values of different cells 228 at different times. In one example, the state machine 410 includes an AND gate 462, an OR gate 464, a first N bit adder 472, a second N bit adder 474, N bit multiplexer 476, and a counter 478. These components operate together to update the counter value according to the decrement signal 432A or the increment signal 432B. In addition, these components operate together to generate the reset signal 212, in response to receiving both the decrement signal 432A and the increment signal 432B. For example, responsive to receiving both the decrement signal 432A and the increment signal 432B simultaneously (e.g., both decrement signal 432A and the increment signal 432B in a HIGH state), the state machine 410 resets counter values represented by the counter signal 488 to a predetermined value (e.g., '0'), and generates the reset signal 212 to cause indicators of the reset status indicators 210 to indicate cells 228 of the memory unit 220 should be reset. For another example, responsive to receiving the decrement signal 432A but not the increment signal 432B (e.g., increment signal 432B in a LOW state and decrement signal 432A in a HIGH state), the state machine 410 decreases the counter value by one or by a predetermined amount. For another example, responsive to receiving the increment signal 432B but not the decrement signal 432A (e.g., increment signal 432B in a HIGH state and decrement signal in a LOW state), the state machine 410 increases the counter value by one or by the predetermined amount.

In one example configuration, inputs of the AND gate 462 are coupled to the decrement signal 432A and the increment signal 432B, and inputs of the OR gate 464 are coupled to the decrement signal 432A and the increment signal 432B. An output 466 of the AND gate 462 is coupled to a reset port 475 of the counter 478, and an output 468 of the OR gate 464 is coupled to an enable port 473 of the counter 478. In this example, the output 468 of the OR gate 464 is output as the reset signal 212. The counter signal 488 output from the counter 478 is coupled to each of the N bit adders 498A, 498B . . . 498J, and N bit adders 472, 474. Outputs 482, 484 of the adders 472, 474, respectively, are coupled to inputs of the N bit multiplexer 476, and the output 486 of the multiplexer 476 is coupled to the counter 478. A control port 471 of the multiplexer 476 may be coupled to the increment signal 432B or the decrement signal 432A.

The counter 478 includes a set of registers or flip flops that each store a corresponding value. The values stored by the set of registers or flip flops collectively represent a counter value. The counter 478 receives the output 486 of the multiplexer 476, and stores values of the outputs 486 in response to the output 468 of the OR gate 464 received at the enable port 473. Specifically, in response to the output 468 of the OR gate 464 in a HIGH state, the counter 478 stores values of the output 486 of the multiplexer 476 as the counter value. The counter 478 also receives the output 466 of the AND gate 462 through the reset port 475, and resets the counter value to a predetermined value (e.g., '0'), responsive to the output 466 of the AND gate 462 in a HIGH state, regardless of the output 468 of the OR gate 464. The counter 478 may be synchronous to the clock signal 265.

The first N bit adder 472 receives the counter signal 488 from the counter 478, and adds '1' to the counter value represented by the counter signal, and the second N bit adder 474 receives the counter signal 488 and adds '−1' to the counter value. Thus, the value represented by the output 482 of the first adder 472 is larger than the counter value by '1,' and the value represented by the output 484 of the second adder 474 is less than the counter value by '1.'

The multiplexer 476 receives the output 482 of the first adder 472 and the output 484 of the second adder 474, and outputs either the output 482 of the first adder 472 or the output 484 of the second adder 474 according to the increment signal 432B. Specifically, responsive to the increment signal 432B (e.g., the increment signal 432B in a HIGH state), the multiplexer 476 outputs the output 482 of the first adder 472 as its output 486, and responsive to an absence of the increment signal 432B (e.g., the increment signal 432B in a LOW state), the multiplexer 476 outputs the output 484 of the second adder 474 as its output 486. Alternatively, the decrement signal 432A may be used instead of the increment signal 432B to select an opposite of the output 482 of the first adder 472 or the output 484 of the second adder 474.

Each of the adders 498 is an N bit adder that receives the counter signal 488 and adds a corresponding value to the counter value to obtain a corresponding logic computation result 422. Assuming that there are 256 of adders 498 (e.g., J=256, N=8), the adder 498A adds "0" to the counter value, the adder 498B adds "1" to the counter value, and the adder 498J adds "255" to the counter value. For example, if the counter value is '70,' the value represented by the logic computation result 422A is '70,' the value represented by the logic computation result 422B is '71,' and the value represented by the logic computation result 422J is '325.'

The multiplexer 450 is an N bit multiplexer that receives logic computation result signals 422 of the adders 498A, 498B . . . 498N, and outputs one of the logic computation result signals 422 according to the address signal 214 as the reset value signal 236. For example, assuming that the address signal 214 identifies cells 228 in a second row, the multiplexer 450 outputs the logic computation result signals 422B of the second adder 498B corresponding to the second row as the reset value signal 236. For another example, assuming that the address signal 214 identifies cells 228 in a $256^{th}$ row, the multiplexer 450 outputs the logic computation result signals 422J of the $256^{th}$ adder 498J (e.g., J=256) corresponding to the $256^{th}$ row as the reset value signal 236.

Figure 5:
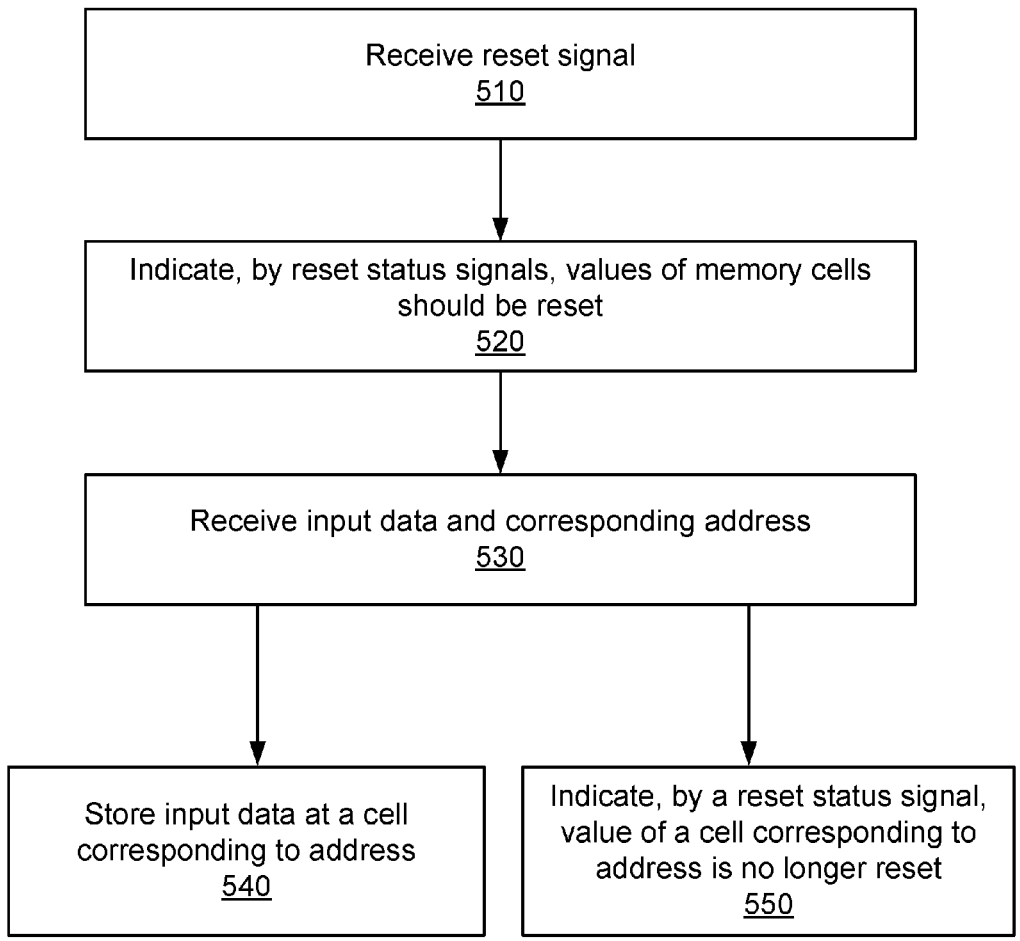
FIG. 5 is a flow chart of storing values in the resettable memory device, according to one embodiment.

FIG. 5 is a flow chart of storing values in the resettable memory device 200, according to one embodiment. Values can be stored at corresponding cells 228 of the memory unit 220 during testing of the DUT. Other embodiments can perform the steps of FIG. 5 in different orders. Moreover, other embodiments can include different and/or additional steps than the ones described here.

The resettable memory device 200 receives 510 a reset signal 212 instructing the resettable memory device 200 to clear or reset states of the cells 228 of the memory unit 220. In response to the reset signal 212, the resettable memory device 200 indicates 520, through the reset status signals 216, that states of the cells 228 should be reset without actually resetting the cells 228.

The resettable memory device 200 receives 530 an input data through the input data signal 222 and a corresponding address identified by the address signal 214 to store the input data at one or more cells 228 identified by the address signal 214. Responsive to the input data to store and the address of the one or more cells 228, the resettable memory device 200 stores 540 the input data at the one or more cells 228 identified by the address signal 214. In addition, the resettable memory device 200 indicates 550, through a reset status signal 216 corresponding to the one or more cells 228, that a value of the one or more cells 228 identified by the address signal 214 should not be reset.

Figure 6:
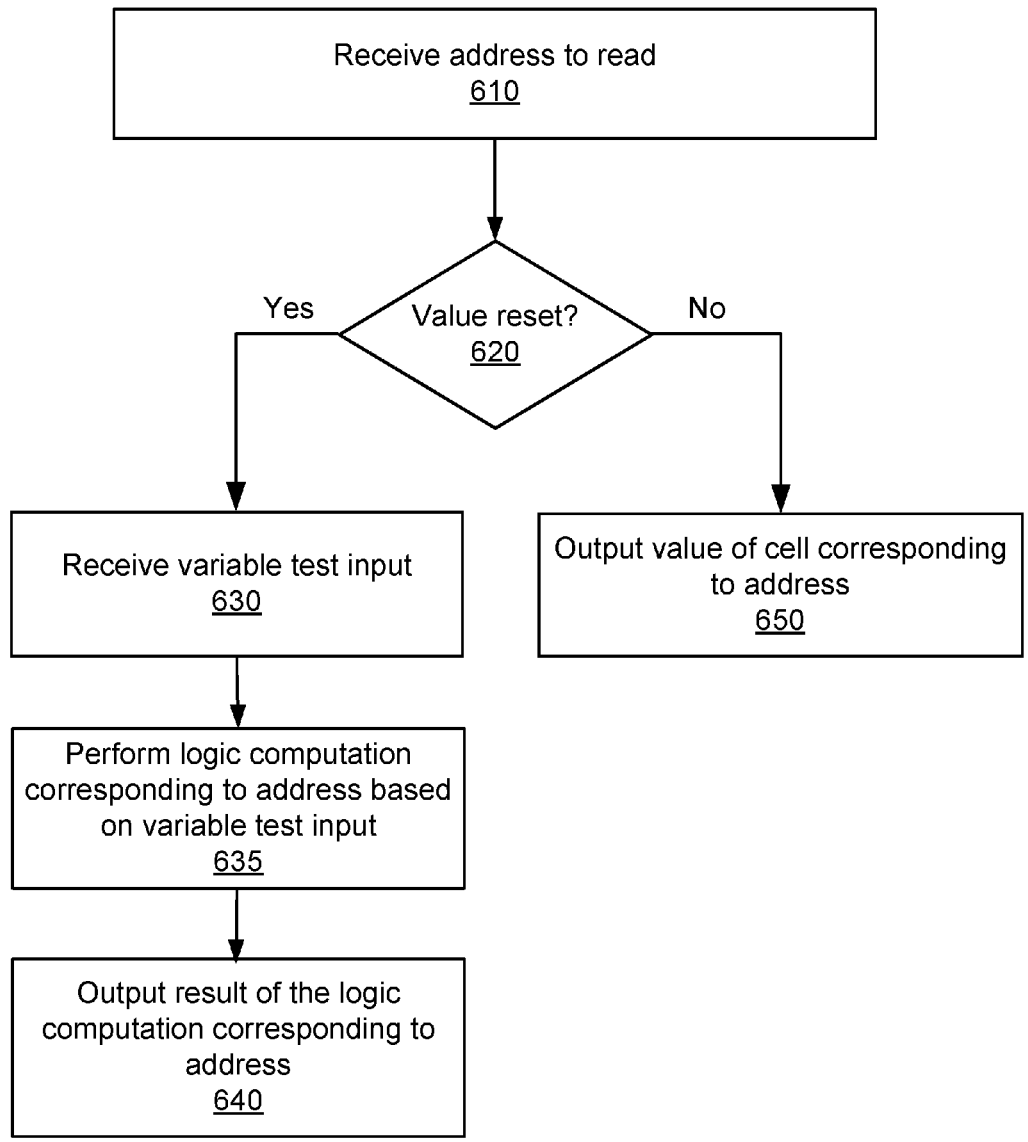
FIG. 6 is a flow chart of outputting values in the resettable memory device, according to one embodiment.

FIG. 6 is a flow chart of outputting values in the resettable memory device 200, according to one embodiment. Other embodiments can perform the steps of FIG. 6 in different orders. Moreover, other embodiments can include different and/or additional steps than the ones described here.

The resettable memory device 200 receives 610 an address signal 214 identifying target cells 228 to be read. The resettable memory device 200 determines 620 whether values of the target cells 228 should be reset or not, based on the reset status signal 216 corresponding to the target cells 228 identified by the address signal 214.

Responsive to the reset status signal 216 indicating that the target cells 228 should be reset, the resettable memory device 200 receives 630 a variable test input signal 232, and performs 635 logic computation identified by the address signal 214 based on the variable test input signal 232. In addition, the resettable memory device 200 outputs 640 the logic computation result instead of stored values of the target cells 228.

Responsive to the reset status signal 216 indicating that the target cells 228 should not be reset, the resettable memory device 200 outputs 650 the stored values of the target cells 228 identified by the address signal 214.

Figure 7:
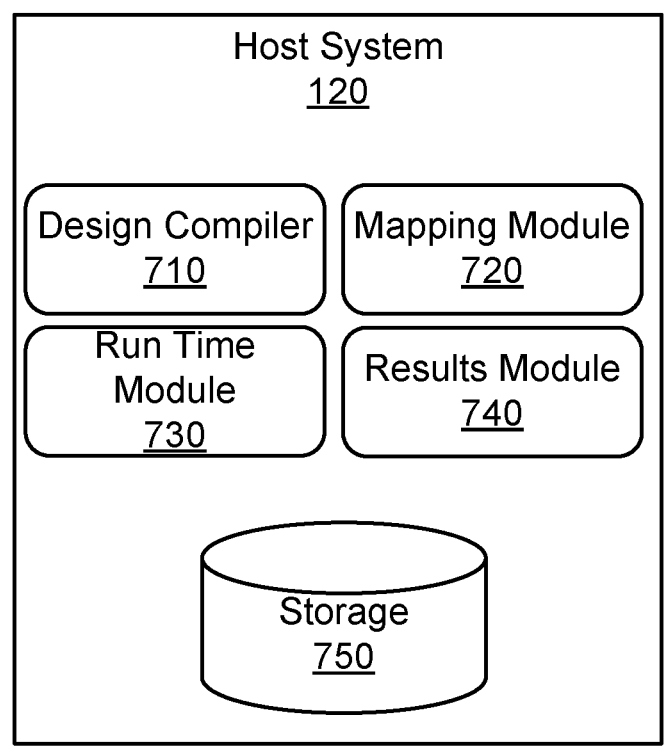
FIG. 7 is an example block diagram of the host system, according to one embodiment.

FIG. 7 is a block diagram illustrating the host system 120 in more detail, according to one embodiment. The host system 120 includes a design compiler 710, mapping module 720, run time module 730, results module 740, and storage 750. Each of these components may be embodied as hardware, software, firmware, or a combination thereof. Additional configuration information for the host system 120 is illustrated in detail with respect to FIG. 8.

The design compiler 710 converts HDL of DUTs into gate level logic. For a DUT that is to be emulated, the design compiler 710 receives a description of the DUT in HDL (e.g., RTL or other level of abstraction). The design compiler 710 synthesizes the HDL of the DUT to create a gate level netlist with a description of the DUT in terms of gate level logic.

In one embodiment, the design compiler 710 identifies signals of the DUT to be traced by the emulator 110 during emulation of the DUT. In one embodiment, the identified signals do not include all signals in the DUT or all states of the DUT. In one embodiment, information is received from a user or from another system indicating the signals of the DUT that should be traced.

The mapping module 720 maps DUTs to FPGAs 130 of the emulator 110. After the design compiler 710 creates a gate level netlist, the mapping module 720 partitions the DUT at the gate level into a number of partitions using the netlist. In one embodiment, the mapping module 720 partitions the DUT by identifying one or more partitions of the DUT to be emulated based on signals to perform analysis of the DUT. The mapping module 720 maps each partition to a corresponding FPGA of the emulator 110. In one approach, the mapping module 720 performs the partitioning and mapping using one or more of the following: design rules, design constraints (e.g., timing or logic constraints), available resources in FPGA 130, limitations on resettable memory devices 140, gates resulting from the HDL, HDL source code, user inputs, and information about the emulator 110.

The mapping module 720 generates one or more binary files to configure the FPGAs 130 to emulate their respective partition. In one embodiment, the mapping module 720 generates a binary file for each FPGA 130. The mapping module 720 stores the binary files in the storage 750. The mapping module 720 also stores signal information in the storage 750 indicating which signals are traced by each FPGA 130 based on the mappings.

The run time module 730 configures the emulator 110 for performing the emulation of a DUT. The run time module 730 transmits to the emulator 110 via interface 115 binary files stored in the storage 750 for the DUT to configure the FPGAs 130 of the emulator 110 to emulate the DUT. The run time module 730 instructs the emulator 110 to emulate the DUT. In one embodiment, prior to the start of the emulation or during the emulation of the DUT, the run time module 730 transmits to the emulator 110 input parameters and/or state machines to configure and control the emulation of the DUT.

The results module 740 provides results from emulating a DUT and simulating sections of the DUT. The results module 740 processes values of the traced signals produced by the simulations of DUT sections and values of the traced signals retrieved from the emulator 110. In one embodiment, the results module 740 retrieves values of the traced signals from the resettable memory device 200 or the storage 750 and generates a user interface for display to a user that includes representations of values of the traced signals. In one embodiment, the results module 740 is a waveform viewer that generates waveforms of traced signals for display. In one embodiment, the results module 740 includes an API to create a visual waveform of traced signals for display to a user. Processing the traced signals may also include the results module 740 counting events based on the traced signals. In another embodiment, the results module 740 includes a binary program (obtained from a system C model, C/C++ model or any other software language) or a script processing the signal values to produce information based on the signal values or a display of that information.

In one embodiment, one or more functions of the host system 120 may be performed at another computer (e.g., a collection of dedicated computers or machines). For example, the design compiler 710 and the mapping module 720 may be included in another computer for compiling and partitioning a DUT.

Computing Machine Architecture

Figure 8:
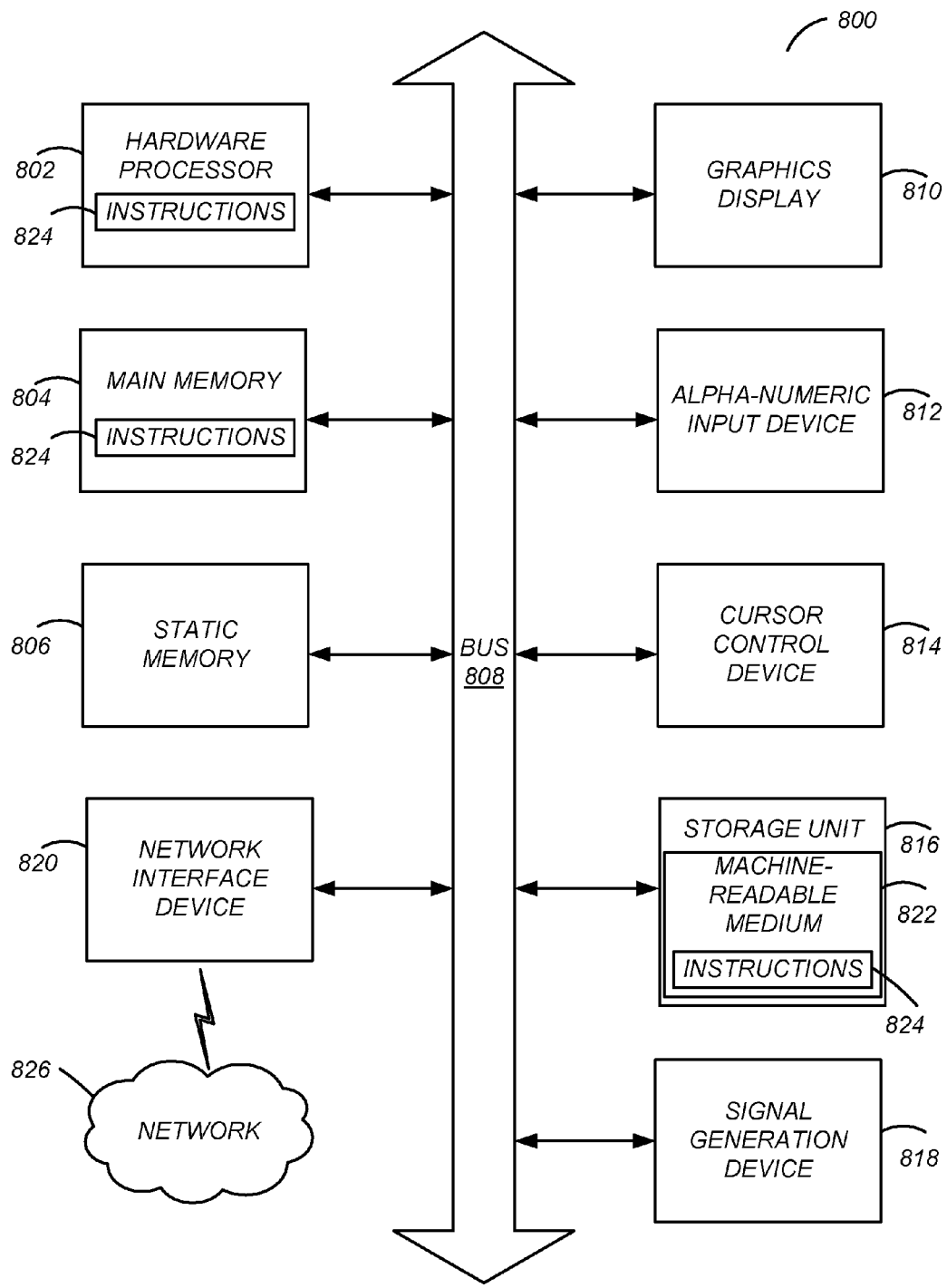
FIG. 8 illustrates one embodiment of components of an example machine able to read instructions from a machine-readable medium and execute them in a processor (or controller).

Turning now to FIG. 8, it is a block diagram illustrating components of an example machine able to read instructions from a machine-readable medium and execute them in one or more processors (or controller). Specifically, FIG. 8 shows a diagrammatic representation of a machine in the example form of a computer system 800 within which instructions 824 (e.g., software or program code) for causing the machine to perform (execute) any one or more of the methodologies described with FIGS. 1-7. Further, the machine can also be configured to operate the modules of FIG. 7. In addition, the computer system 800 may be used for one or more of the entities (e.g., host system 120, emulator 110) illustrated in the emulation environment 100 of FIG. 1.

The example computer system 800 includes a processor 802 (e.g., a central processing unit (CPU), a graphics processing unit (GPU), a digital signal processor (DSP), one or more application specific integrated circuits (ASICs), one or more radio-frequency integrated circuits (RFICs), or any combination of these), a main memory 804, and a static memory 806, which are configured to communicate with each other via a bus 808. The computer system 800 may further include graphics display unit 810 (e.g., a plasma display panel (PDP), a liquid crystal display (LCD), a projector, or a cathode ray tube (CRT)). The computer system 800 may also include alphanumeric input device 812 (e.g., a keyboard), a cursor control device 814 (e.g., a mouse, a trackball, a joystick, a motion sensor, or other pointing instrument), a storage unit 816, a signal generation device 818 (e.g., a speaker), and a network interface device 820, which also are configured to communicate via the bus 808. In addition, the computer system 800 may have a touch sensitive display.

The storage unit 816 includes a non-transitory machine-readable medium 822 (or a non-transitory computer readable medium) on which is stored instructions 824 (e.g., software) embodying any one or more of the methodologies or functions described herein. The instructions 824 (e.g., software) may also reside, completely or at least partially, within the main memory 804 or within the processor 802 (e.g., within a processor's cache memory) during execution thereof by the computer system 800, the main memory 804 and the processor 802 also constituting machine-readable media. The instructions 824 (e.g., software) may be transmitted or received over a network 826 via the network interface device 820.

While machine-readable medium 822 is shown in an example embodiment to be a single medium, the term "machine-readable medium" should be taken to include a single medium or multiple media (e.g., a centralized or distributed database, or associated caches and servers) able to store instructions (e.g., instructions 824). The term "machine-readable medium" shall also be taken to include any medium that is capable of storing instructions (e.g., instructions 824) for execution by the machine and that cause the machine to perform any one or more of the methodologies disclosed herein. The term "machine-readable medium" includes, but not be limited to, data repositories in the form of solid-state memory devices, optical media, and magnetic media.

As is known in the art, a computer system 800 can have different and/or other components than those shown in FIG. 8. In addition, the computer system 800 can lack certain illustrated components. For example, a computer system 800 acting as the emulator 110 may include one or more hardware processors 802, multiple storage units 816, a network interface device 820, and multiple configurable logic circuits (as described above with reference to FIG. 1), among other components, but may lack an alphanumeric input device 812 and a cursor control device 814. For another example, a computer system 800 acting as a host system 120 may include one or more hardware processors 802. The host system 120 with multiple processors 802 may perform multiple emulations in parallel on multiple threads, processes and/or machines. Subset of sections may be distributed either by a user or automatically by a software program to produce a set of signals based on an input set of signals through simulations performed in parallel.

In one example, instructions executed by a process of the host system 120 configure one or more FPGAs to implement a resettable memory device 200 as disclosed herein.
Additional Configuration Considerations Advantageously, a resettable memory device 200 disclosed herein enables a reset function to be performed with a non-resettable memory unit 220, where a reset value of a cell of the memory unit 220 can be changed at different time periods, without having to redesign or recompile the DUT.

In one aspect, a sequential logic sampling circuit 230 of the resettable memory device 200 receives a variable test input signal 232 including values changeable by a user, and ensures logic computation results according to the variable test input signal 232 to be output at proper timings. For example, in case an asynchronous logic sampling circuit is implemented instead of the sequential logic sampling circuit 230, an unexpected delay (e.g., propagation delay) of the variable test input signal 232 may cause the logic computation to be performed based on the variable test input signal 232 that may still be in a transition state at an input of the logic sampling circuit, rendering inaccurate reset values to be output. By implementing the sequential logic sampling circuit 230, the reset status indicator circuit 210, and the memory unit 220 to be synchronous to a clock signal 265, accuracy of different reset values of a cell of the memory unit 220 at different time periods can be assured.

In another aspect, a reset signal 212 can be generated by the resettable memory device 200 internally, based on the external variable test input signal 232. Specifically, the sequential logic sampling circuit 230 receives the variable test input signal 232 and generates the reset signal 212 to cause the reset status indicator circuit 210 to indicate cells 228 identified by the address signal 214 should be reset. Generation of the reset signal 212 within the resettable memory device 200 based on the external variable test input signal 232 allows values of indicators 338 in the reset status indicator circuit 210 to be updated at proper timing, according to external variable test input signal 232.

It is noted that although the subject matter is described in the context of emulation environment for emulation of digital circuits and systems, the principles described may be applied to analysis of any digital electronic devices. Moreover, while the examples herein are in the context of an emulation environment including FPGAs, the principles described herein can apply to other analysis of hardware implementations of any digital logic circuitries or software simulation such as EDAs.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of components, modules (herein may be also referred to as "tools"), or mechanisms, for example, as illustrated in FIGS. 1-8. Modules may constitute either software modules (e.g., code embodied on a machine-readable medium or in a transmission signal) or hardware modules. A hardware module is tangible unit capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

In some embodiments, a hardware module may be implemented electronically. For example, a hardware module may comprise dedicated circuitry or logic that is permanently configured (e.g., as a special-purpose processor, such as a field programmable gate array (FPGA) or an application-specific integrated circuit (ASIC)) to perform certain operations. A hardware module may also comprise programmable logic or circuitry (e.g., as encompassed within a general-purpose processor or other programmable processor) that is temporarily configured by software to perform certain operations. Hardware module implemented herein may be implemented in dedicated and permanently configured circuitry, or in temporarily configured circuitry (e.g., configured by software).

The various operations of example methods described herein may be performed, at least partially, by one or more processors, e.g., processor 802, that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

The one or more processors may also operate to support performance of the relevant operations in a "cloud computing" environment or as a "software as a service" (SaaS). For example, at least some of the operations may be performed by a group of computers (as examples of machines including processors), these operations being accessible via a network (e.g., the Internet) and via one or more appropriate interfaces (e.g., application program interfaces (APIs).)

The performance of certain of the operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

Some portions of this specification are presented in terms of algorithms or symbolic representations of operations on data stored as bits or binary digital signals within a machine memory (e.g., a computer memory). These algorithms or symbolic representations are examples of techniques used by those of ordinary skill in the data processing arts to convey the substance of their work to others skilled in the art. As used herein, an "algorithm" is a self-consistent sequence of operations or similar processing leading to a desired result. In this context, algorithms and operations involve physical manipulation of physical quantities. Typically, but not necessarily, such quantities may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memory devices (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the invention. This description should be read to include one or at least one and the singular also includes the plural unless it is obvious that it is meant otherwise.

Upon reading this disclosure, those of skill in the art will appreciate still additional alternative structural and functional designs for performing principles described herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A resettable memory device comprising:
    a non-resettable memory unit having a plurality of cells for storing states of signals;
    a reset status indicator circuit having a storage component that stores indicators, each indicator indicating whether states of corresponding cells should be reset or not;
    a sequential logic sampling circuit configured to receive a variable test input signal and generate logic computation result by performing sequential logic computation according to the variable test input signal; and
    a multiplexer comprising a first input, a second input, and a control input, the first input coupled to an output of the non-resettable memory unit, the second input coupled to an output of the sequential logic sampling circuit, the control input coupled to an output of the reset status indicator circuit, the multiplexer configured to:
    receive an indicator associated with a subset of cells from the plurality of cells through the control input,
    responsive to the indicator indicating states of the subset of cells should not be reset, output states of the subset of cells, the states of the subset of cells received from the non-resettable memory unit through the first input, and
    responsive to the indicator indicating the states of the subset of cells should be reset, output logic computation result as reset values of the subset of cells, the logic computation result received from the sequential logic sampling circuit through the second input, the reset values of the subset of cells changed during different time periods according to states of the variable test input signal changing during the different time periods.

2. The resettable memory device of claim 1, wherein the variable test input signal is user configurable during emulation.

3. The resettable memory device of claim 1, wherein the non-resettable memory unit is synchronous to a clock, and the sequential logic sampling circuit is synchronous to the clock.

4. The resettable memory device of claim 1,
    wherein the sequential logic sampling circuit comprises a reset output port, the sequential logic sampling circuit to generate a reset signal associated with the subset of cells based on the variable test input signal and to output the reset signal at the reset output port, and
    wherein the reset status indicator circuit comprises a reset input port coupled to the reset output port of the sequential logic sampling circuit, the reset status indicator circuit to configure the indicator associated with the subset of cells to indicate the states of the subset of cells should be reset, responsive to the reset signal received through the reset input port.

5. The resettable memory device of claim 4, wherein the subset of cells from the plurality of cells are identified by an address signal, the address signal coupled to the non-resettable memory unit, the reset status indicator circuit, and the sequential logic sampling circuit.

6. The resettable memory device of claim 1, wherein the sequential logic sampling circuit comprises:
    a state machine to receive the variable test input signal and to generate a state machine output according to the variable test input signal, the state machine being synchronous to a clock, the logic computation result generated based on the state machine output.

7. The resettable memory device of claim 6, wherein the sequential logic sampling circuit further comprises:
    a plurality of logic circuits having inputs coupled to the state machine, the plurality of logic circuits to output logic computation result signals at outputs of the plurality of logic circuits based on the state machine output from the state machine, and
    another multiplexer coupled to the outputs of the plurality of logic circuits, an output of said another multiplexer coupled to the second input of the multiplexer, said another multiplexer configured to output one of the logic computation result signals to the second input of the multiplexer as the logic computation result according to an address signal, the address signal identifying the subset of cells from the plurality of cells.

8. The resettable memory device of claim 1, wherein each indicator indicates whether said corresponding cells disposed in a corresponding row should be reset or not.

9. A non-transitory computer readable medium comprising instructions, the instructions when executed by at least a processor causing the processor to configure a field programmable gate array (FPGA) to implement a resettable memory device, the instructions configuring the FPGA to:
    implement a non-resettable memory unit having a plurality of cells for storing states of signals;
    implement a reset status indicator circuit having a storage component that stores indicators, each indicator indicating whether states of corresponding cells should be reset or not;
    implement a sequential logic sampling circuit configured to receive a variable test input signal and generate logic computation result by performing sequential logic computation according to the variable test input signal; and
    implement a multiplexer comprising a first input, a second input, and a control input, the first input coupled to an output of the non-resettable memory unit, the second input coupled to an output of the sequential logic sampling circuit, the control input coupled to an output of the reset status indicator circuit, the multiplexer configured to:
        receive an indicator associated with a subset of cells from the plurality of cells through the control input,
        responsive to the indicator indicating states of the subset of cells should not be reset, output states of the subset of cells, the states of the subset of cells received from the non-resettable memory unit through the first input, and
        responsive to the indicator indicating the states of the subset of cells should be reset, output logic computation result as reset values of the subset of cells, the logic computation result received from the sequential logic sampling circuit through the second input, the reset values of the subset of cells changed during different time periods according to states of the variable test input signal changing during the different time periods.

10. The non-transitory computer readable medium of claim 9, wherein the variable test input signal is user configurable during emulation.

11. The non-transitory computer readable medium of claim 9, wherein the non-resettable memory unit is synchronous to a clock, and the sequential logic sampling circuit is synchronous to the clock.

12. The non-transitory computer readable medium of claim 9,
    wherein the sequential logic sampling circuit comprises a reset output port, the sequential logic sampling circuit to generate a reset signal associated with the subset of cells based on the variable test input signal and to output the reset signal at the reset output port, and
    wherein the reset status indicator circuit comprises a reset input port coupled to the reset output port of the sequential logic sampling circuit, the reset status indicator circuit to configure the indicator associated with the subset of cells to indicate the states of the subset of cells should be reset, responsive to the reset signal received through the reset input port.

13. The non-transitory computer readable medium of claim 12, wherein the subset of cells from the plurality of cells are identified by an address signal, the address signal coupled to the non-resettable memory unit, the reset status indicator circuit, and the sequential logic sampling circuit.

14. The non-transitory computer readable medium of claim 9, wherein the sequential logic sampling circuit comprises:
   a state machine to receive the variable test input signal and to generate a state machine output according to the variable test input signal, the state machine being synchronous to a clock, the logic computation result generated based on the state machine output.

15. The non-transitory computer readable medium of claim 14, wherein the sequential logic sampling circuit further comprises:
   a plurality of logic circuits having inputs coupled to the state machine, the plurality of logic circuits to output logic computation result signals at outputs of the plurality of logic circuits based on the state machine output from the state machine, and
   another multiplexer coupled to the outputs of the plurality of logic circuits, an output of said another multiplexer coupled to the second input of the multiplexer, said another multiplexer configured to output one of the logic computation result signals to the second input of the multiplexer as the logic computation result according to an address signal, the address signal identifying the subset of cells from the plurality of cells.

16. The non-transitory computer readable medium of claim 9, wherein each indicator indicates whether said corresponding cells disposed in a corresponding row should be reset or not.

17. An emulator comprising:
   a non-resettable memory unit having a plurality of cells for storing states of signals;
   a reset status indicator circuit having a storage component that stores indicators, each indicator indicating whether states of corresponding cells should be reset or not;
   a sequential logic sampling circuit configured to receive a variable test input signal and generate logic computation result by performing sequential logic computation according to the variable test input signal; and
   a multiplexer comprising a first input, a second input, and a control input, the first input coupled to an output of the non-resettable memory unit, the second input coupled to an output of the sequential logic sampling circuit, the control input coupled to an output of the reset status indicator circuit, the multiplexer configured to:
   receive an indicator associated with a subset of cells from the plurality of cells through the control input,
   responsive to the indicator indicating states of the subset of cells should not be reset, output states of the subset of cells, the states of the subset of cells received from the non-resettable memory unit through the first input, and
   responsive to the indicator indicating the states of the subset of cells should be reset, output logic computation result as reset values of the subset of cells, the logic computation result received from the sequential logic sampling circuit through the second input, the reset values of the subset of cells changed during different time periods according to states of the variable test input signal changing during the different time periods.

18. The emulator of claim 17, wherein the variable test input signal is user configurable during emulation.

19. The emulator of claim 17, wherein the sequential logic sampling circuit comprises:
   a state machine to receive the variable test input signal and to generate a state machine output according to the variable test input signal, the state machine being synchronous to a clock, the logic computation result generated based on the state machine output.

20. The emulator of claim 19, wherein the sequential logic sampling circuit further comprises:
   a plurality of logic circuits having inputs coupled to the state machine, the plurality of logic circuits to output logic computation result signals at outputs of the plurality of logic circuits based on the state machine output from the state machine, and
   another multiplexer coupled to the outputs of the plurality of logic circuits, an output of said another multiplexer coupled to the second input of the multiplexer, said another multiplexer configured to output one of the logic computation result signals to the second input of the multiplexer as the logic computation result according to an address signal, the address signal identifying the subset of cells from the plurality of cells.

* * * * *